United States Patent
Wei et al.

(10) Patent No.: US 10,250,130 B2
(45) Date of Patent: Apr. 2, 2019

(54) CAPACITOR RECONFIGURATION OF A SINGLE-INPUT, MULTI-OUTPUT, SWITCHED-CAPACITOR CONVERTER

(71) Applicant: President and Fellows of Harvard College, Cambridge, MA (US)

(72) Inventors: Gu-Yeon Wei, Boston, MA (US); Tao Tong, Cambridge, MA (US); David Brooks, Cambridge, MA (US); Saekyu Lee, Somerville, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 15/554,437

(22) PCT Filed: Mar. 25, 2016

(86) PCT No.: PCT/US2016/024192
§ 371 (c)(1),
(2) Date: Aug. 30, 2017

(87) PCT Pub. No.: WO2016/160562
PCT Pub. Date: Oct. 6, 2016

(65) Prior Publication Data
US 2018/0069472 A1 Mar. 8, 2018

Related U.S. Application Data
(60) Provisional application No. 62/139,334, filed on Mar. 27, 2015.

(51) Int. Cl.
*H02M 3/07* (2006.01)
*H03K 5/08* (2006.01)
(Continued)

(52) U.S. Cl.
CPC ............ *H02M 3/07* (2013.01); *H02M 3/137* (2013.01); *H03K 5/003* (2013.01); *H03K 5/08* (2013.01);
(Continued)

(58) Field of Classification Search
CPC .. H02M 3/07; H02M 3/073; H02M 2003/071; H02M 2003/072;
(Continued)

(56) References Cited

U.S. PATENT DOCUMENTS

2009/0322304 A1* 12/2009 Oraw ...................... H02J 1/102
323/312
2010/0073084 A1* 3/2010 Hur .......................... H03F 1/025
330/124 R
(Continued)

FOREIGN PATENT DOCUMENTS

WO 2012074967 6/2012

OTHER PUBLICATIONS

International Search Report and Written Opinion for PCT/US16/24192, dated Jun. 27, 2016.

*Primary Examiner* — Patrick C Chen
(74) *Attorney, Agent, or Firm* — Peter A. Nieves; Sheehan Phinney Bass & Green PA

(57) ABSTRACT

A switched capacitor converter and a method for configuring the switched capacitor converter are disclosed. The switched capacitor converter includes a capacitance resource with a cathode and an anode and a switching matrix with a first terminal, a second terminal, a third terminal, and at least one switch configured to switch among two or more connections selected from the group consisting of a connection of the first terminal to the anode and the second terminal to the cathode and a connection of the second terminal to the anode and the third terminal to the cathode.

11 Claims, 7 Drawing Sheets

(51) Int. Cl.
   *H03K 5/003*   (2006.01)
   *H02M 3/137*   (2006.01)
   *H02M 1/00*    (2006.01)

(52) U.S. Cl.
   CPC ............... *H02M 2001/0003* (2013.01); *H02M 2001/009* (2013.01)

(58) Field of Classification Search
   CPC ..... H02M 2003/076; H02M 2003/077; H02M 2003/078; H02M 3/137; H02M 2003/075; H03K 5/003; H03K 5/00; H03K 5/07
   USPC ........................................................ 327/321
   See application file for complete search history.

(56) References Cited

U.S. PATENT DOCUMENTS

2010/0308932 A1    12/2010  Rangarajan et al.
   2012/0286888 A1    11/2012  Hsieh et al.
   2015/0171768 A1*   6/2015   Perreault ............... H02M 7/537
                                                      330/251

\* cited by examiner

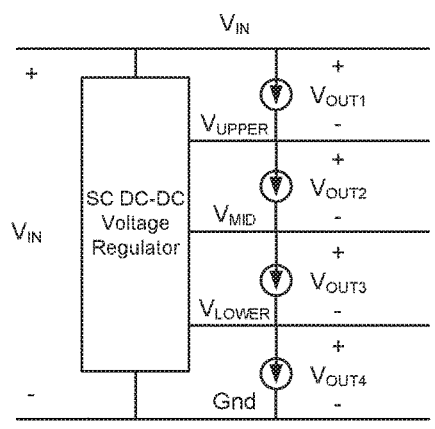 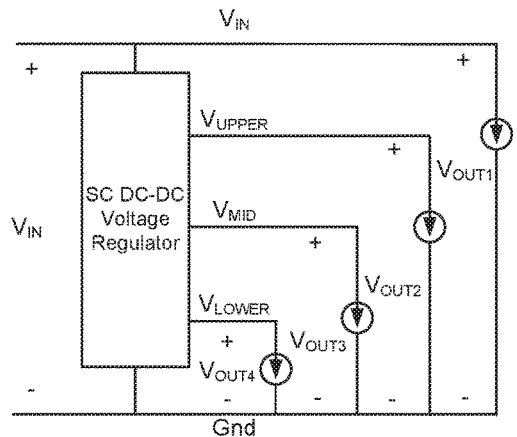
FIG. 2A
(PRIOR ART)
FIG. 2B
(PRIOR ART)

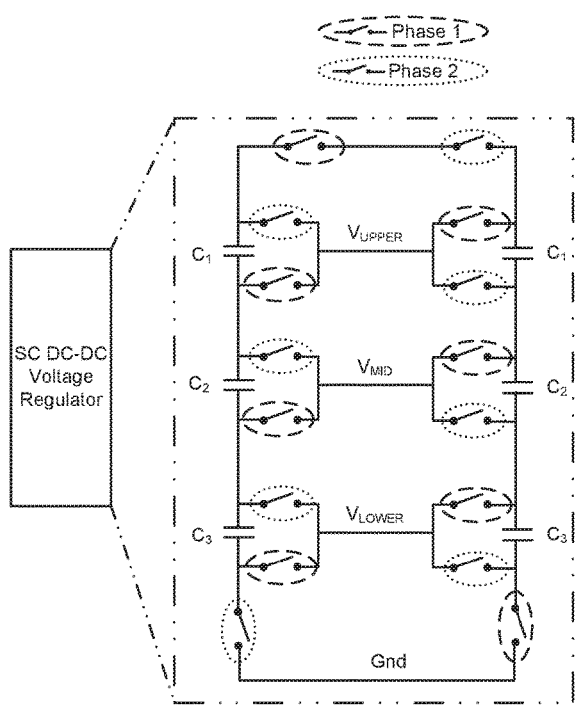
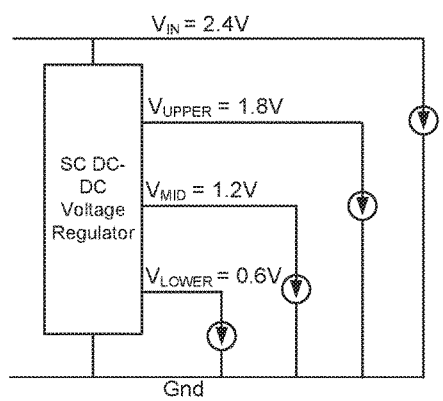
FIG. 2C
(PRIOR ART)
FIG. 2D
(PRIOR ART)

CAPACITOR RECONFIGURATION OF A SINGLE-INPUT, MULTI-OUTPUT, SWITCHED-CAPACITOR CONVERTER

CROSS-REFERENCE TO RELATED APPLICATIONS

This application claims the benefit of U.S. Provisional Patent Application Ser. No. 62/139,334, filed Mar. 27, 2015, entitled "Capacitor Reconfiguration Of A Single-Input, Multi-Output, Switched-Capacitor Converter," which is incorporated by reference herein in its entirety.

STATEMENT REGARDING FEDERALLY SPONSORED RESEARCH OR DEVELOPMENT

This invention was made with Government support under National Science Foundation contract number CCF-0926148 and National Science Foundation contract number CCF-1218298. The Government has certain rights in the invention.

FIELD OF THE INVENTION

The present invention relates to electronic circuitry, and more particularly, is related to a voltage regulator.

BACKGROUND OF THE INVENTION

There are many applications where a power supply is called upon to provide multiple power supply rails for a system. Power supply rails are electrical connections that deliver separate current and voltages to the system. Different supply rails can have the same or different supply voltages. For example, power supply rails may power different chips or different blocks (circuits) in the same chip having different power requirements. Typically, different rails have different voltages and consume different amounts of power over time, depending on the behavior of the load circuitry. FIG. 1A shows an example of a system 100 that requires multiple supply rails. An application System on a Chip (SoC) 110 includes first cores 111 drawing 1.2V, second cores 112 drawing 0.6V, an analog-to-digital converter (ADC) 113 drawing 1.2V, and an input/output (I/O) device 114 drawing 1.8V. A radio frequency (RF) chip 120 requires power at 1.2V and 0.6V, a digital camera 130 requires 2.4V, and a digital display 140 requires 1.2V and 2.4V.

Individual DC-DC converters may be used to generate each of the required voltages separately. However, this may be economically inefficient because the power consumption of each block changes over time, as shown in FIG. 1B. The size and cost of a DC-DC converter is related to the maximum power that it is configured to deliver.

Another way to generate multiple rails is to use a single switched capacitor (SC) converter or a hybrid converter with SC conversion built in. FIGS. 2A-2D show single-input multi-output symmetric ladder SC converters. FIG. 2A is a circuit diagram of an SC converter drive having multiple output rails having voltage-stacking outputs. FIG. 2B is a circuit diagram of an SC converter drive having multiple output rails having non-stacking inputs. The current sources represent the load blocks that consume energy. Beyond the two examples in FIGS. 2A and 2B, the load blocks may be connected between any two of the rails, including $V_{IN}$, $V_{UPPER}$, $V_{MID}$, $V_{LOWER}$ and Gnd. FIG. 2C is a circuit diagram of a drive implementation example of an SC converter. FIG. 2D is a diagram of an exemplary circuit using the SC converter to power the heterogeneous system in FIG. 1A. The symmetric ladder SC converter in FIG. 2C operates in a two-phase fashion, where the first phase is indicated by a dashed line, and the second phase is indicated by a dotted line. The symmetric ladder SC converter in FIG. 2C operates by alternating the first and second phase switches, closing the first phase switches and opening the second phase switches during the first phase, and closing the second phase switches and opening the first phase switches during the second phase. FIG. 2D shows the SC converter of FIG. 2C being used to power the heterogeneous system example in FIG. 1A. The switches may be controlled, for example by opening or closing based upon a received switching signal.

The level of supported power and conversion efficiency of an SC converter depends on the total capacitance used in the converter. However, previous SC converters have not addressed performance issues due to inadequate allocation of capacitance sources. Therefore, there is a need in the industry to address one or more of these deficiencies.

SUMMARY OF THE INVENTION

Embodiments of the present invention provide a switched capacitor converter and a method for configuring the switched capacitor converter. The switched capacitor converter includes a capacitance resource with a cathode and an anode, and a switching matrix with a first terminal, a second terminal, a third terminal, and at least one switch configured to switch among two or more connections selected from the group consisting of a connection of the first terminal to the anode and the second terminal to the cathode and a connection of the second terminal to the anode and the third terminal to the cathode.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principles of the invention.

FIG. 2A is a circuit diagram of an SC converter drive having multiple output rails having voltage-stacking outputs.

FIG. 2B is a circuit diagram of an SC converter drive having multiple output rails having non-stacking inputs.

FIG. 2C is a circuit diagram of a drive implementation example of an SC converter.

FIG. 2D is a diagram of an exemplary circuit using the SC converter to power the heterogeneous system in FIG. 1A.

DETAILED DESCRIPTION

Figure 1A:
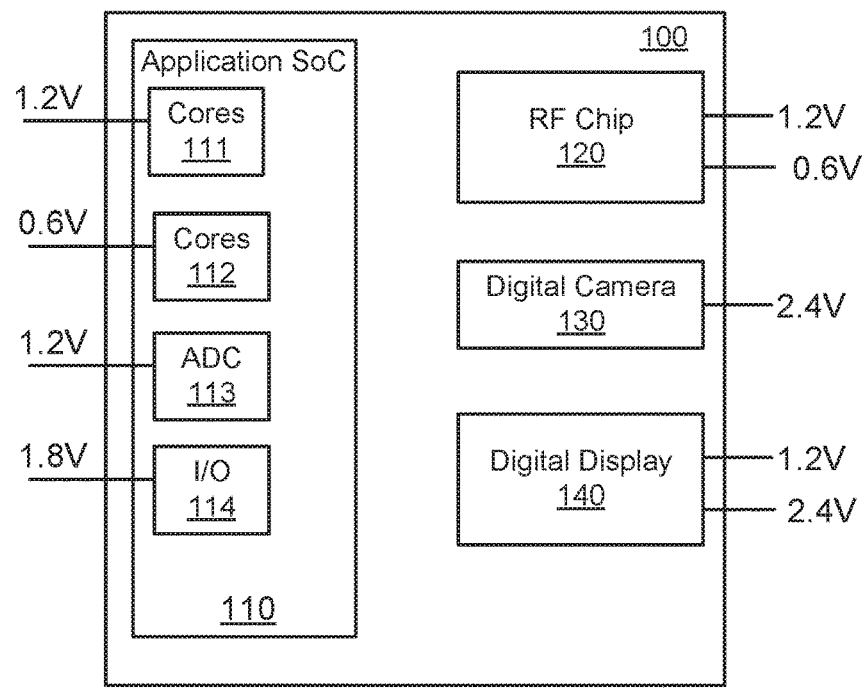
FIG. 1A is a schematic diagram showing an exemplary heterogeneous system example that uses multiple supply rails.
Figure 1B:
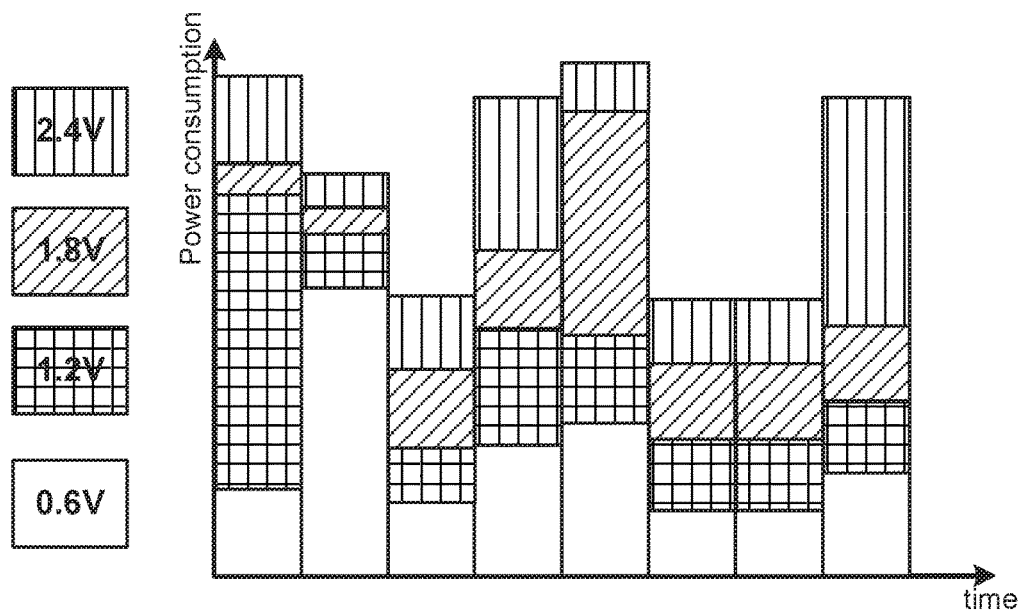
FIG. 1B is a diagram plotting the power consumption of the system of each rail of the system of FIG. 1A over time.

Reference will now be made in detail to embodiments of the present invention, examples of which are illustrated in the accompanying drawings. Wherever possible, the same reference numbers are used in the drawings and the description to refer to the same or like parts.

Figures 3A, 3B:
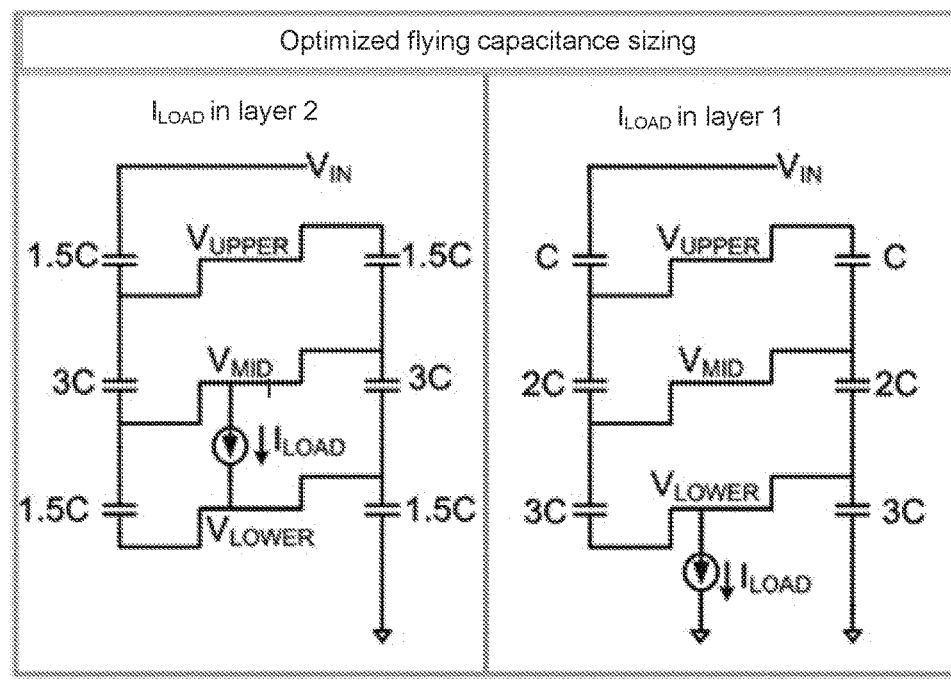
FIG. 3A is a circuit diagram of an optimized capacitance allocation for a first different load profile.
FIG. 3B is a circuit diagram of an optimized capacitance allocation for a second different load profile.

As noted in the Background section, the supported power and conversion efficiency of an SC converter depends on the total capacitance used in the converter. In order to improve performance, it is desirable for the capacitance sources to be properly allocated to different capacitors in the converter. In a multi-output converter, optimized capacitance allocation may depend on layer-to-layer load conditions, as shown in FIGS. 3A-3B. As defined herein, "layer" means the voltage domain between two adjacent voltage rails. The circuit blocks are connected in different layers. FIG. 3A shows a first load profile where only one output layer consumes current, and FIG. 3B shows a second load profile where only one output layer consumes current. The appropriate capacitance allocations are different for the first load profile and the second load profile. Because the power consumption may change over time, it is desirable to dynamically allocate the capacitance resources to optimize the converter performance. For example, sometimes, the load profile may be as shown in FIG. 3A, and other times the load profile may be as shown in FIG. 3B The following definitions are useful for interpreting terms applied to features of the embodiments disclosed herein, and are meant only to define elements within the disclosure.

As used herein, a "unit capacitor" refers to a non-dedicated single unit of a multi-unit SC converter. A unit may have different size in terms of capacitance, which may be determined by the circuit designer. A multi-unit SC unit may include, zero, one, two, three, or more unit capacitors. A unit capacitor may be optionally switched to be associated with a "ladder capacitor" to contribute to the capacitance level of the multi-unit SC converter.

As used herein, a "ladder capacitor" refers to a dedicated capacitance resource. In general, a ladder capacitor is combined with a unit capacitor, for example, in a parallel configuration, a series configuration, or a combination of parallel and series.

As used herein, "flying capacitance allocation" refers to the switching of non-dedicated capacitance resources based upon the present power consumption needs of the system.

As used herein, a "switching matrix" refers to a plurality of switches, for example, transistor based switches, used to re-allocate flying capacitance resources between SC units.

Since the optimized flying capacitance allocation depends on layer-to-layer load conditions in a voltage stacking application, it is preferable for the converter to dynamically modify the sizes of its capacitors according to current load conditions. The present invention presents embodiments of a capacitance reconfiguration scheme for this type of converter.

Figure 4:
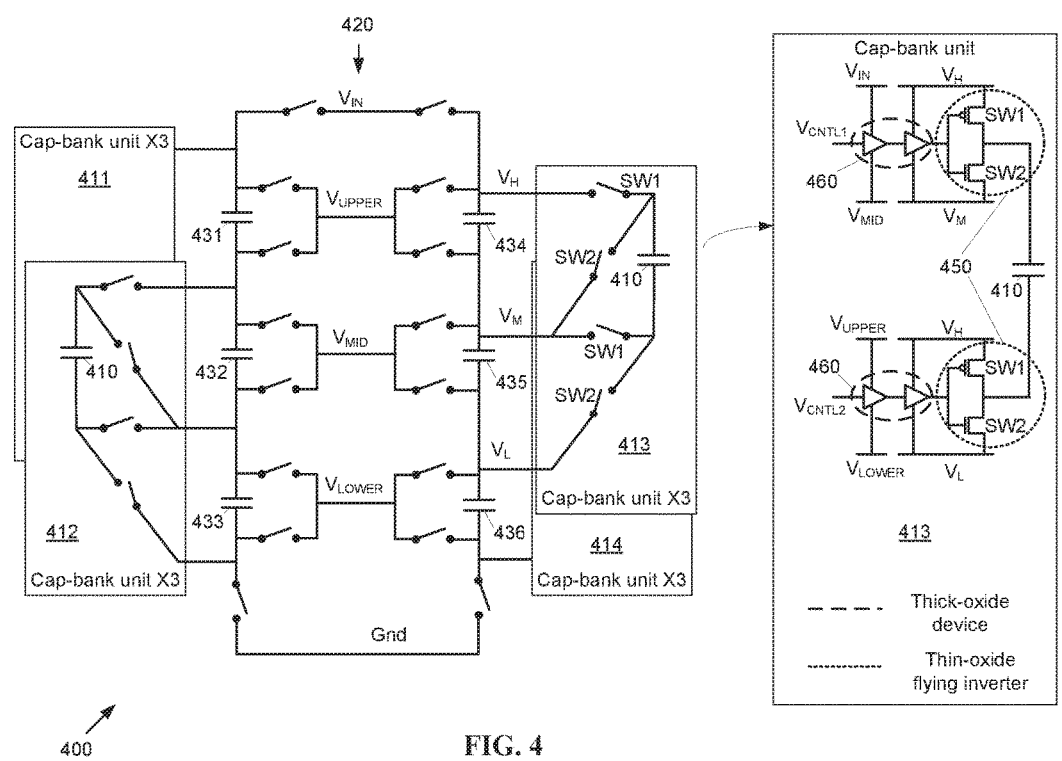
FIG. 4 is a circuit diagram of an exemplary first embodiment of a reconfigurable SC ladder converter

FIG. 4 shows a first embodiment of a reconfigurable SC ladder 400. Under the first embodiment, four reconfigurable capacitor banks (cap-bank units) 411-414 are connected symmetrically to the central SC ladder 420. The central SC ladder 420 includes multiple switches and ladder capacitors 431-436. Each cap-bank unit 411-414 includes a unit capacitor 410 and three identical (×3) cap-bank switches (labeled SW1 or SW2) that allow each cap-bank unit 411-414 to individually configure its connections to the central SC ladder 420. All SW1 switches switch at the same time. Similarly, all SW2 switches switch at the same time. By closing either SW1 or SW2, each individual unit capacitor 410 in a cap-bank unit 411-414 can be connected to different ladder capacitors 431-436 in the central SC ladder 420.

The switches SW1, SW2 in the cap-bank units 411-414 also add conductive and switching loss to the reconfigurable SC ladder 400. To minimize the loss, the first embodiment uses a pair of thin-oxide flying inverters 450 to implement the reconfigurable switches SW1 and SW2. It should be noted that the first embodiment is not intended to be limited to the use of thin-oxide flying inverters, instead, other devices that may be used as a switch may be provided, for example, a thick oxide inverter. In each pair of switches SW1 and SW2, the gates are connected together, driven by another small flying inverter 460, for example, a thick oxide device. By driving SW1 and SW2 by the small flying inverter 460, rather than connecting the gates to a fixed voltage to turn ON/OFF SW1 and SW2, the gate voltage switches SW1 and SW2 together with $V_H$, $V_M$, and $V_L$ when the central SC ladder 420 is switching. SW1 and SW2 can be implemented using thin-oxide transistors to reduce the associated conductive and switching loss. Since load conditions fluctuate at a much lower rate than the main switching frequency of the central SC ladder 420, switching losses associated with SW1 and SW2 are small and justified by the efficiency improvements that re-configurability offers.

In general, a cap-bank unit 411-414 is configured to connect a unit capacitor 410 to the central SC ladder 420 in such a manner that the capacitance across one or more ladder capacitors 431-436 is changed based upon the configuration of switches connecting the unit capacitor 410 of the cap-bank unit 411-414 to the one or more ladder capacitors 431-436. Each unit capacitor 410 has a cathode and an anode, and likewise, the connections of the cap-bank unit 411-414 to the central SC ladder 420 may be referred to as the cathode or anode connection, depending upon whether the connection is in electrical communication with the cathode or anode of the unit capacitor 410. The point at which each electrical connection between the cap-bank-unit 411-414 is made to the central SC ladder 420 is referred to herein as a "terminal."

For example, a reconfigurable SC ladder 400 may have an input voltage $V_{IN}$ of 3.6V, and outputs $V_{UPPER}$, $V_{MID}$, and $V_{LOWER}$ of 2.7V, 1.8V, and 0.9V, respectively, with a total capacitance on the order of 4.5 nF and unit capacitance of approximately 37 pF. In this example, the maximal switching frequency of the central SC ladder is about 250 MHz while the total output power of all four layers combined is about 80 mW. Of course, many other configurations and variations are possible.

Other embodiments are also possible. For example, while the first embodiment employs identical cap-bank units, in alternative embodiments different cap-banks may have different capacitance characteristics. For example, differently configured cap-banks may provide for different capacitance granularity for different voltage ranges. Further, while the first embodiment employs four reconfigurable capacitor banks, other embodiments may employ one, two, three, five or more reconfigurable capacitor banks. While the first embodiment employs reconfigurable capacitor banks connected symmetrically to the central SC ladder, in alternative embodiments, two or more of the capacitor banks may be connected asymmetrically to the central SC ladder. Even though capacitor reconfiguration is implemented and has been proven in a ladder SC converter, the same or a similar configuration is applicable in other converters that utilize switched capacitor circuits, where there is a desire to dynamically allocate the capacitance resources to different capacitors. As such, the abovementioned is provided for exemplary purposes and the present invention is not intended to be limited by the abovementioned embodiments.

Figure 5:
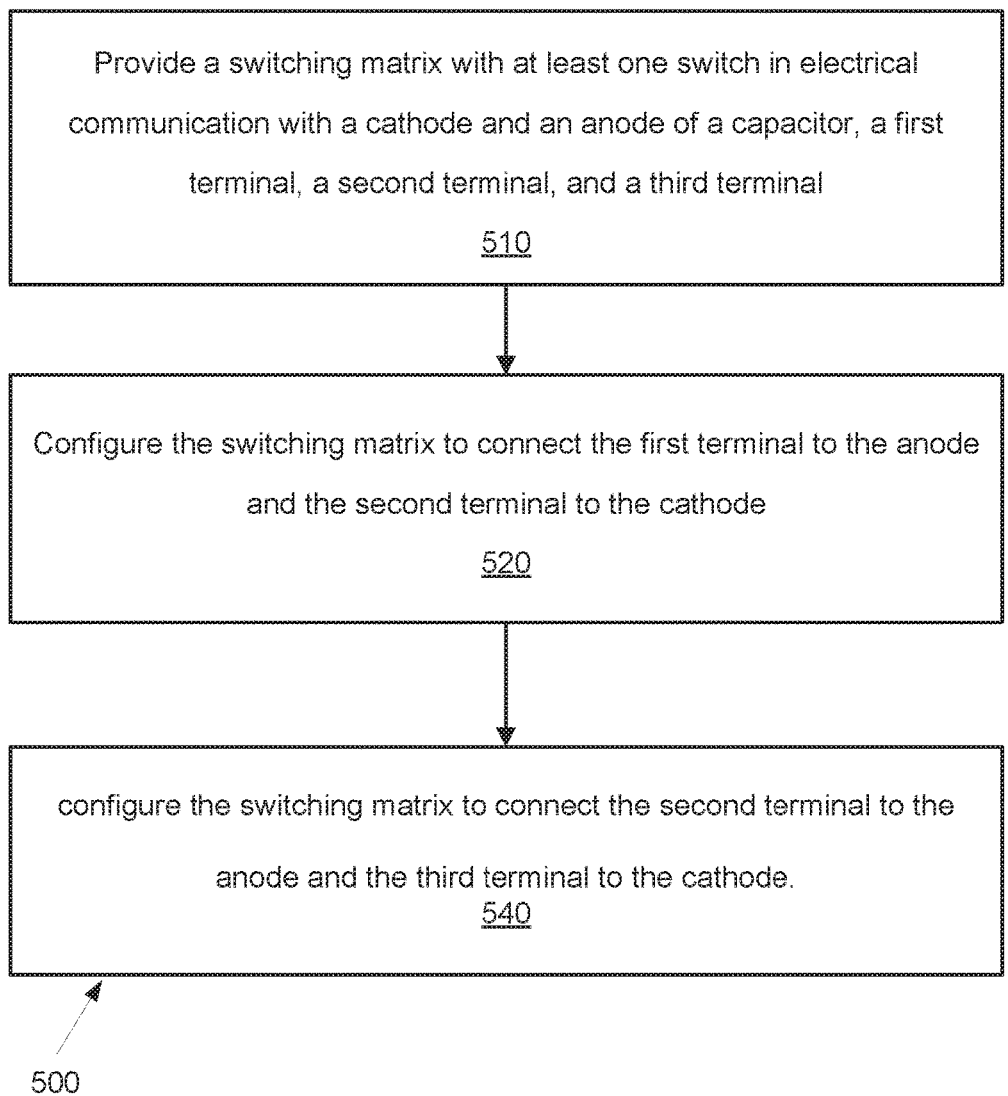
FIG. 5 is a flowchart depicting an exemplary method for dynamically allocating a capacitance resource across three terminals.
Figure 6A:
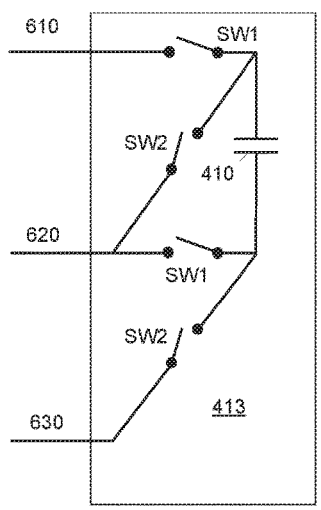
FIG. 6A is a detail circuit diagram of the exemplary switching matrix of FIG. 4.
Figure 6B:
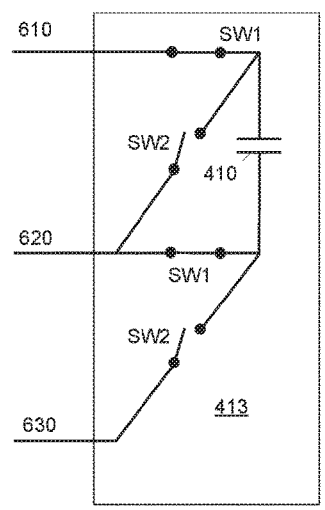
FIG. 6B is a circuit diagram of the exemplary switching matrix of FIG. 6A with a first group of switches closed and a second group of switches open.
Figure 6C:
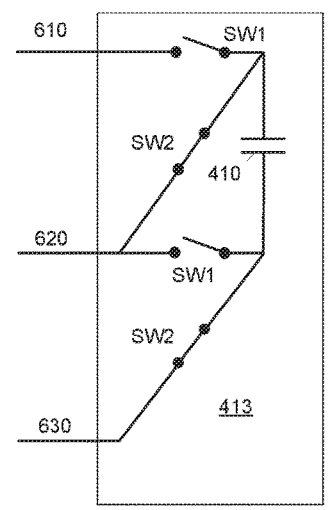
FIG. 6C is a circuit diagram of the exemplary switching matrix of FIG. 6A with the first group of switches open and a second group of switches closed.

FIG. 5 is a flowchart 500 depicting a method for dynamically allocating a capacitance resource including a cathode and an anode across at least two of a first terminal, a second terminal, and a third terminal. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The flowchart 500 is discussed with reference to FIGS. 6A-6B As shown by block 510, a switching matrix 413 FIG. 6A is provided having at least one switch, in electrical communication with a cathode and an anode of a capacitor 410, a first terminal 610, a second terminal 620, and a third terminal 630. The switching matrix 413 is configured to connect the cathode and/or anode to the first terminal 610, second terminal 620, and/or third terminal 630 in one or more of the following arrangements: (1) connect the first terminal 610 to the anode and the second terminal 620 to the cathode, as shown by block 520 and FIG. 6B, and (2) connect the second terminal 620 to the anode and the third terminal 630 to the cathode as shown by block 540 and FIG. 6C.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A capacitor bank, comprising:
    a capacitance resource comprising a cathode and an anode; and
    a switching matrix comprising a first terminal, a second terminal, a third terminal;
    a first switch pair comprising:
        a first switch connecting the first terminal to the anode; and
        a second switch connecting the second terminal to the cathode, wherein the first switch and the second switch are configured to switch between both open and both closed;
    a second switch pair comprising:
        a third switch connecting the second terminal to the anode; and
        a fourth switch connecting the third terminal to the cathode, wherein the third switch and the fourth switch are configured to switch between both open and both closed;
    a first flying inverter comprising the first switch and the third switch; and
    a second flying inverter comprises the second switch and the fourth switch,
    wherein the first switch pair and the second switch pair are configured to switch between:
        a connection of the first terminal to the anode and the second terminal to the cathode; and
        a connection of the second terminal to the anode and the third terminal to the cathode.

2. The capacitor bank of claim 1, wherein the first flying converter and/or the second flying inverter further comprises a pair of thin-oxide transistors.

3. The capacitor bank of claim 2, wherein for the first and/or second switch pair, a gate of a first thin-oxide transistor of the pair of thin-oxide transistors is connected to an inverted gate of the second thin-oxide transistor of the pair of thin-oxide transistors.

4. A single-input multi-output switched-capacitor (SC) power supply, comprising:
    a plurality of SC converter units, each unit comprising at least one individual capacitor and a plurality of switches controllable by switching signals;
    a plurality of rails, each rail configured to provide an output voltage level, each rail switchably connected to one or more of the plurality of SC converter units; and
    a capacitor bank according to claim 1, wherein each of the first terminal, the second terminal, and the third terminal are connected to a different one of the plurality of rails,
    wherein the voltage level of each rail is configured to be different with respect to a ground.

5. The single-input multi-output SC power supply of claim 4, wherein the configured voltage level of each rail is selected from the group consisting of a first voltage level, a second voltage level comprising a voltage level lower than the first voltage level, and one or more intermediate voltage levels each having a voltage level between the first voltage level and the second voltage level.

6. A method for dynamically allocating a capacitance resource comprising a cathode and an anode across at least two of a first terminal, a second terminal, and a third terminal, comprising the steps of:
    providing a switching matrix comprising a first switch pair further comprising:
        a first switch connecting the first terminal to the anode; and
        a second switch connecting the second terminal to the cathode, wherein the first switch and the second switch are configured to switch between both open and both closed; and
    a second switch pair comprising:
        a third switch connecting the second terminal to the anode;

a fourth switch connecting the third terminal to the cathode, wherein the third switch and the fourth switch are configured to switch between both open and both closed;

a first flying inverter comprising the first switch and the third switch; and a second flying inverter comprising the second switch and the fourth switch, wherein the switching matrix is configured to perform the steps of:

configuring the switching matrix to connect the first terminal to the anode and the second terminal to the cathode;

and configuring the switching matrix to connect the second terminal to the anode and the third terminal to the cathode.

7. The method of claim 6, wherein the first flying inverter comprises a first pair of thin-oxide transistors, and the second flying inverter comprises a second pair of thin-oxide transistors.

8. The method of claim 7, further comprising the step of for the first and/or second pair of thin-oxide transistors connecting a gate of a first thin-oxide transistor to an inverted gate of a second thin-oxide transistor.

9. The method of claim 8, further comprising the step of switching the first switch pair and the second switch pair upon sensing a voltage change at the connected gates.

10. The method of claim 6, further comprising the steps of:

connecting to the first, second and third terminals, a single-input multi-output switched-capacitor (SC) power supply, comprising a plurality of SC converter units and a plurality of rails, each rail configured to provide an output voltage level, each rail switchably connected to one or more of the plurality of SC converter units.

11. The method of claim 10, wherein the voltage level of each rail is selected from the group consisting of a first voltage level, a second voltage level comprising a voltage level lower than the first voltage level, and one or more intermediate voltage levels each having a voltage level between the first voltage level and the second voltage level.

* * * * *

UNITED STATES PATENT AND TRADEMARK OFFICE
CERTIFICATE OF CORRECTION

| | | |
|---|---|---|
| PATENT NO. | : 10,250,130 B2 | Page 1 of 1 |
| APPLICATION NO. | : 15/554437 | |
| DATED | : April 2, 2019 | |
| INVENTOR(S) | : Gu-Yeon Wei et al. | |

It is certified that error appears in the above-identified patent and that said Letters Patent is hereby corrected as shown below:

In the Specification

Column 1, Line 15 Please correct paragraph 2, entitled "Statement Regarding Federally Sponsored Research or Development" to read as follows:
"This invention was made with government support under 0926148 and 1218298 awarded by the National Science Foundation. The government has certain rights in the invention."

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*